United States Patent
Sugihara et al.

[11] Patent Number: 5,994,030
[45] Date of Patent: Nov. 30, 1999

[54] PATTERN-FORMING METHOD AND LITHOGRAPHIC SYSTEM

[75] Inventors: Kazuyoshi Sugihara; Hiromi Niiyama; Shunko Magoshi; Atsushi Ando; Tetsuro Nakasugi; Shinji Sato; Yumi Watanabe; Yosimitu Kato; Toru Shibata; Katsuya Okumura, all of Tokyo, Japan

[73] Assignee: Kabushiki Kaisha Toshiba, Kawasaki, Japan

[21] Appl. No.: 09/030,888

[22] Filed: Feb. 26, 1998

[30] Foreign Application Priority Data

Feb. 28, 1997 [JP] Japan ................................. 9-046683

[51] Int. Cl.$^6$ ..................................................... G03C 5/00
[52] U.S. Cl. ............................................ 430/296; 430/328
[58] Field of Search ..................................... 430/296, 328

[56] References Cited

U.S. PATENT DOCUMENTS

5,789,140  8/1998  Chou et al. .............................. 430/296

FOREIGN PATENT DOCUMENTS

9-7924  1/1997  Japan .

OTHER PUBLICATIONS

F. Benistant et al., "A heavy ion implanted pocket 0.10 μm n-type metal-oxide-semiconductor field effect transistor with hybrid lithography (electron-beam/deep ultraviolet) and specific gate passivation process", J. Vac. Sci. Technol. B 14(6), pp.4051–4054, Nov./Dec. 1996.

R. Jonckheere et al., Electron beam / DUV intra-level mix-and-match lithography for random logic 0.25μm CMOS, Microelectronic Engineering 27, pp. 231–234, 1995.

*Primary Examiner*—Christopher G. Young
*Attorney, Agent, or Firm*—Finnegan, Henderson, Farabow, Garrett & Dunner, L.L.P.

[57] ABSTRACT

A rough pattern exceeding the resolution limit of light exposure is formed by light resolution. A fine pattern not exceeding the resolution limit of light exposure is formed by charge-beam exposure. Combining the rough pattern and the fine pattern produces a desired pattern. The sharing of the work between light exposure and charge-beam exposure exhibits the high throughput of light exposure and the excellent resolving power of charge-beam exposure.

10 Claims, 8 Drawing Sheets

PATTERN-FORMING METHOD AND LITHOGRAPHIC SYSTEM

BACKGROUND OF THE INVENTION

This invention relates to a pattern forming method for forming fine patterns with great throughput and a lithographic system for realizing the method.

Photolithography has been used during the manufacture of a wide variety of semiconductor devices because of its simplicity and low cost. Continually advancing technical innovation has brought about use of shorter wavelength in recent years (e.g., use of a KrF excimer laser light source), which has realized the manufacture of patterns 0.25 µm or less in width. To miniaturize the devices further, a ArF excimer laser light source and a Levenson-type phase-shift mask both with much shorter wavelength are being developed. It is expected that they will be used as mass-production lithographic tools conforming to 0.15 µm rules. There are a lot of problems to be solved before such tools are realized. This elongates the time required to develop them, leading to the fear that the development cannot catch up with the pace at which the devices are being miniaturized.

In the case of electron-beam lithography, a first candidate for post-photolithography, it has been proved that use of a finely focused beam produces patterns as fine as 0.01 µm. Although there seems to be no problem for the time being from the viewpoint of miniaturization, electron-beam lithography has a throughput problem in terms of device mass-production tools. Because fine patterns are drawn one by one, the inevitable result is that the time needed to draw the patterns is long. To make the drawing time shorter, several systems have been developed. One of them is a cell projection system that draws patterns in such a manner that part of repetitive portions of the ULSI patterns are lumped together. Use of those systems, however, have not succeeded in achieving throughput coming up to the throughput of photolithography.

As a method of increasing the throughput of electron-beam lithography, the following method has been proposed: pattern transfer to the same resist is performed by light exposure and electron-beam exposure to reduce the area exposed to the electron-beam and increase the number of wafers that the electron-beam drawing machine can process in an hour. That is, a light beam and an electron beam are used to expose layer.

Jpn. Pat. Appln. KOKAI Publication No. 4-155812 has disclosed that in a pattern formation lithographic process, pattern transfer to the same resist is performed by exposure to a light beam and an electron beam with a phase shift mask. In the approach, most of the patterns forming the elements are transferred through a phase shift mask and the portions where defects have occurred because of the arrangement of the phase shifter are repaired with the electron beam. This minimizes the area drawn by the electron beam and increases the number of wafers that the electron-beam drawing machine can process in an hour.

With this method, although the drawing area need not be large, it is impossible to transfer patterns smaller than the critical resolution of the phase shift mask. Consequently, the method will not be able to deal with the miniaturization of future devices.

In manufacturing few-of-a-kind elements, it takes considerable time to produce a mask. To overcome this problem, Jpn. Pat. Appln. KOKAI Publication No. 1-293616 has disclosed the following method: a function block common to various semiconductor elements is printed on the same resist by light exposure and then a pattern peculiar to each semiconductor element is drawn using an electron beam. Namely, a mask for the portions common to the individual elements is made beforehand and only the remaining portions where the pattern differs from element to element are drawn using an electron beam. This method makes it possible to shorten the time needed to design the elements and manufacture them, because it is not necessary to produce a mask for each pattern.

The method, however, cannot deal with a case where the function block contains patterns smaller than the critical resolution of light exposure. In the method, most of the patterns to be drawn with an electron beam are interconnections. To form the interconnections by electron beam exposure, the patterns have to be drawn one by one. Inevitably, this process takes a lot of time.

As described above, the conventional method of projecting a light beam and an electron beam on the same layer to improve the throughput has the following problems: the resolving power of electron-beam exposure is not used sufficiently and the throughput is not raised to that of the optical stepper.

BRIEF SUMMARY OF THE INVENTION

The object of the present invention is to provide a pattern forming method capable of forming fine patterns with high throughput and a lithographic system for realizing the method.

With the present invention, a rough pattern exceeding the resolution limit of light exposure is formed by light exposure and a fine pattern not exceeding the resolution limit of light exposure is formed by charge-beam exposure. Combining the rough pattern and the fine pattern produces a desired pattern. The sharing of the work between light exposure and charge-beam exposure exhibits the high throughput of light exposure and the excellent resolving power of charge-beam exposure. This achieves high throughput and realizes exposure suitable for the formation of fine patterns. Moreover, use of an electron beam to expose fine patterns adds an allowance to the focal depth in the step portion inevitably developed between the element region and the element-isolating region, which makes it possible to form fine patterns with high accuracy. This leads to the elimination of a flattening process for reducing steps, which contributes to shortening the processes.

The photosensitive material is developed after both light exposure and charge-beam exposure have been completed.

The photosensitive material has to be sensitive to both light and a charge beam. A chemical amplification resist may be used as the photosensitive material.

To improve the resolution of light exposure, it is desirable that light in the far ultraviolet region should be used in light exposure.

The throughput is improved further by simultaneously exposing part of the repetitive portions in the desired pattern to a charge beam.

The photosensitive material is composed of an antireflection film and a resist.

For charge-beam exposure, at least one of the antireflection film and the resist has only to be conductive.

Data on the desired pattern is divided into data on the rough pattern and data on the fine pattern on the basis of the critical resolution of light exposure.

Since a shift in the exposure position during light exposure results from the distortion of the lens, it can be measured in advance. By adjusting data on the position information of the fine pattern on the previously calculated amount of a shift in the position, the rough pattern is aligned with the fine pattern with high accuracy.

Preferably, the charge beam is an electron beam with high resolution.

The ratio of the number of light exposure machines to the number of charge-beam exposure machines is determined so that the processing capability of light exposure and that of charge-beam exposure may be substantially in balance. This causes the processing speed of the light exposure process to substantially balance with the processing speed of the charge-beam exposure process, improving the total throughput.

Because the substrate coated with the photosensitive material is conveyed through a transport mechanism, this prevents the substrate from being contaminated with chemical pollution, physical pollution, temperature, and humidity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, preferred embodiments of the present invention will be explained.

Figure 1:
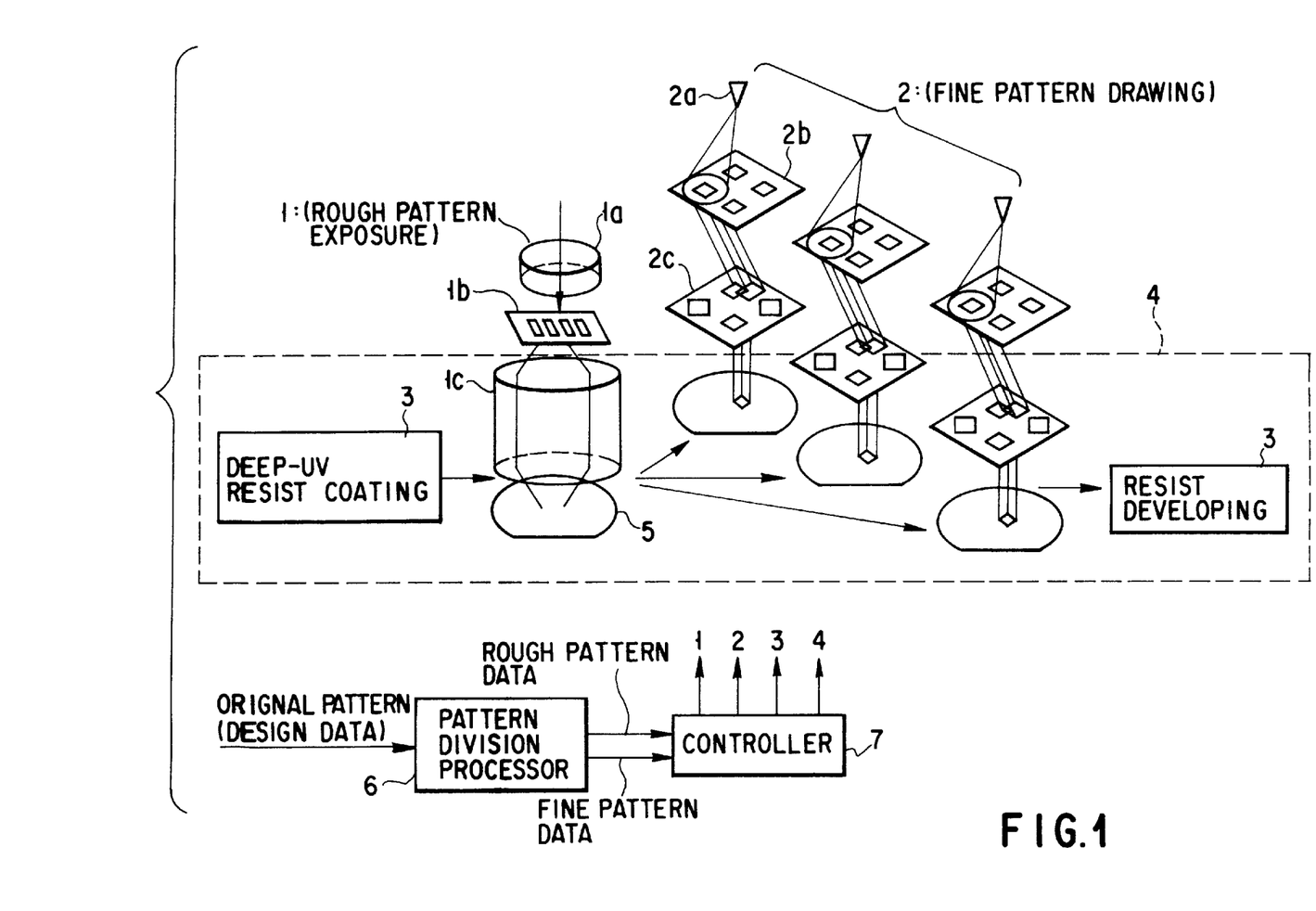
FIG. 1 shows a schematic configuration of a lithographic system according to a preferred embodiment of the present invention.
Figure 2:
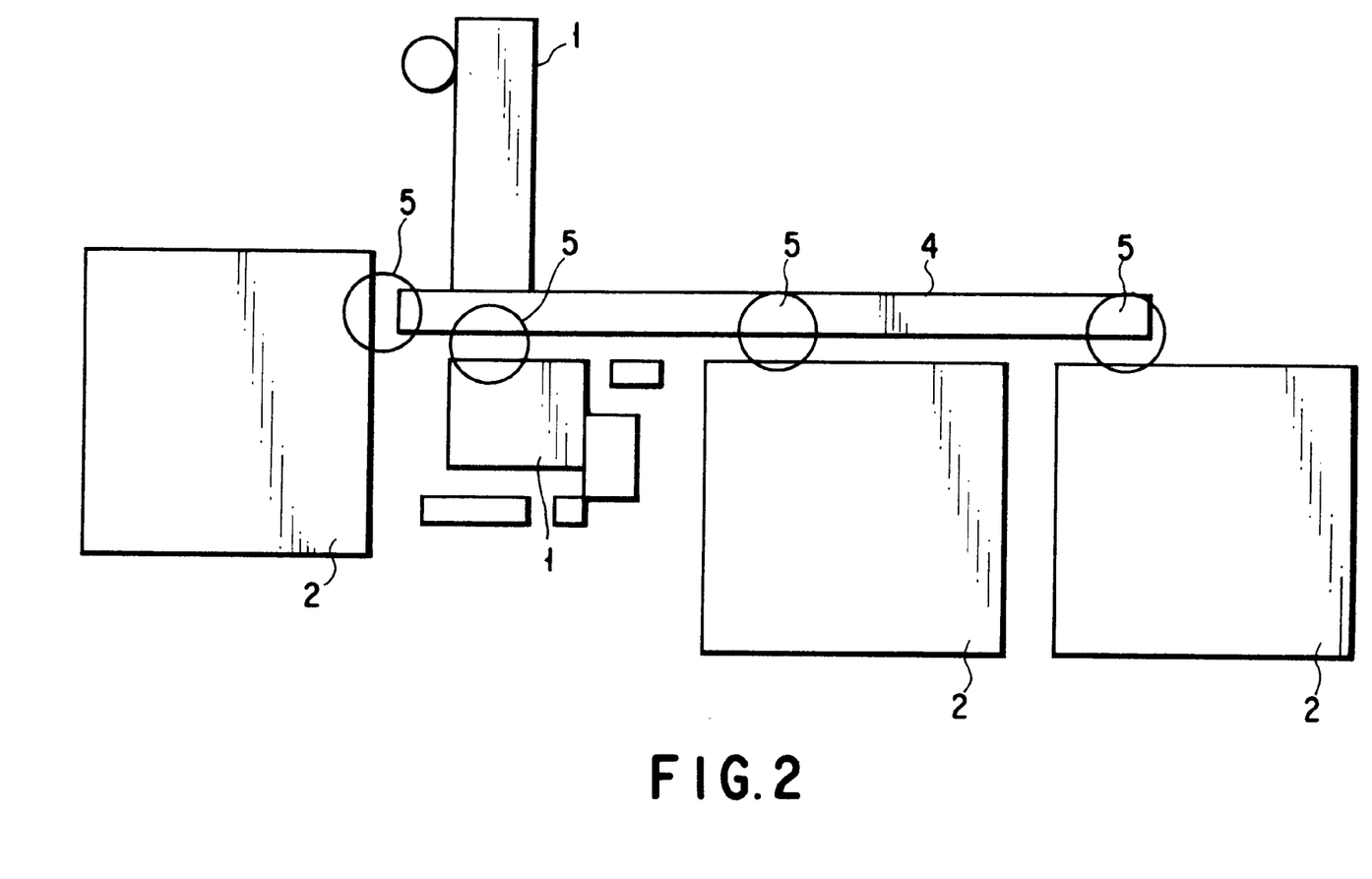
FIG. 2 shows a plane layout of the lithographic system of FIG. 1.

FIG. 1 is a schematic representation of a lithographic system according to an embodiment of the present invention. FIG. 2 is a plan view of the lithographic system of the embodiment. The original pattern data (design data) corresponds to the final exposure pattern of the resist. On the basis of the resolution limit of light exposure, the original pattern data is divided into data representing a rough pattern exceeding the resolution limit of light exposure and data on a fine pattern not exceeding the resolution limit.

At least one optical stepper 1 is provided to transfer the rough pattern to the coated resist on a substrate 5, a semiconductor wafer serving as a substrate to be treated. The optical stepper 1 is a Deep-UV stepper using, for example, excimer laser light.

To draw a fine pattern on the resist, not only the optical stepper 1 for exposure to light but also at least one cell-projection electron-beam exposure machine 2 have been provided in the lithographic system.

The lithographic system of the embodiment is provided with a resist coating/developing machine 3 that has both the function of applying resist and an antireflection film to the substrate 5 and the function of developing the resist whose pattern has been exposed to light. A transport mechanism 4 is provided to transport the substrate 5 between machines 1, 2, and 3 in an atmosphere-controlled environment in order to protect the substrate 5 from various types of pollution by treating the substrate 5 in a complete in-line process.

The optical stepper 1 for light exposure includes an illumination lens 1a, a photomask 1b in which part of an LSI pattern has been formed, and a projection lens 1c. An electron-beam exposure machine 2 for electron-beam exposure includes an electron gun 2a and shaping aperture masks 2b and 2c. The electron beam released from the electron gun 2a can be shaped into such a basic figure as a rectangle or a triangle, and into various cells serving as basic elements for repetition by changing the way the shaping aperture masks 2b and 2b are laid on top of the other.

Next, the flow of lithography with the system constructed as described above will be explained. The flow of lithography is realized by the controller 7 controlling the machines 1 to 4 according to sequence data.

In the resist coating/developing machine 3, the wafer 5 on which the antireflection film and resist have been coated is conveyed by the transport mechanism 4 to the optical stepper 1. To prevent the wafer from being charged up during exposure to the electron beam, at least one of the resist and antireflection film is conductive. The optical stepper 1 projects a reduced pattern of the reticle onto the entire wafer 5. This causes a rough pattern to be transferred to the resist. The transfer of the rough pattern is repeated as the transfer position is changed.

After light exposure has been completed, the wafer 5 is conveyed by the transport mechanism 4 to the electron-beam exposure machine 2. The electron-beam exposure machine 2 further draws a fine pattern on the resist to which the rough pattern has been transferred through light exposure.

To increase the accuracy with which the rough pattern is aligned with the fine pattern, the electron-beam exposure machine 2 senses a base pattern and a latent image of the rough pattern formed by light exposure and aligns the fine pattern drawn by the electron beam with the base pattern and/or the rough pattern. The latent image is sensed by scanning the resist with a low-dose electron beam leaving the resist unchanged and sensing the secondary electrons or the reflected electrons generated.

After the alignment is complete, the electron-beam exposure machine 2 draws a fine pattern on the resist on the wafer 5 with the electron beam. The drawing of the fine pattern is repeated as the drawing position is changed. In this case, to increase the throughput of the electron-beam drawing, the fine pattern is exposed repeatedly by a cell projection method.

Generally, the throughput of electron-beam exposure with the electron-beam exposure machine 2 is lower than that of light exposure with the optical stepper 1. Because of this, the ratio of the number of optical steppers 1 to that of electron-beam exposure machines 2 installed has been adjusted so as to prevent the processing capability of the optical stepper 1 from being limited by the processing capability of the electron-beam exposure machine 2, that is, so as to substantially balance the processing speed of light exposure with that of electron-beam exposure. It is only natural that the number of electron-beam exposure machines 2 installed is larger than that of optical steppers 1 installed. The electron-beam exposure machines 2 are arranged so that the wafers 5 delivered from the stepper 1 may be processed in parallel, and are controlled by a controller 7.

Instead of installing the optical steppers 1 and the electron-beam exposure machines 2 in the ratio of the number of the former to that of the latter previously adjusted so as to substantially balance the processing speed of the former with that of the latter, a specific number of optical steppers 1 and electron-beam exposure machines 2 may be provided beforehand and the controller 7 may control the ratio of the number of the former in operation to that of the latter in operation during an actual exposure process in such a manner that the processing speed of the former and that of the latter are substantially in balance.

In contrast, when the throughput of the electron-beam exposure machine 2 is larger than that of the optical stepper 1, the number of steppers 1 in operation is made smaller than that of electron-beam exposure machines 2.

Even when the number of electron-beam exposure machines 2 is made larger than that of optical steppers 1, the wafers will flow in series in the system as a whole. As a consequence, a single resist coating/developing machine 4 is sufficient for the exposure machines 1 and 2.

The sharing of the work between light exposure and charge-beam exposure exhibits the high throughput of light exposure and the excellent resolving power of charge-beam exposure.

After both the rough pattern and fine pattern have been transferred to the resist, the transport mechanism 4 returns the wafer 5 to the coating/developing machine 3, which develops the resist and completes the pattern formation.

As a resist usable in this type of system, a chemical-amplification resist (e.g., UV2HS or UVN-HS made by Shipley Far East LTD. featuring sensitivity to both light and an electron beam and high resolution is preferable.

Since the properties of such a chemical-amplification resist easily deteriorate in the presence of various chemical substances in the air, the resist is treated in and between the machines 1, 2, and 3 in an controlled environment within the transport mechanism 4. The environment is controlled, taking into account not only chemical pollution but also physical pollution, temperature, and humidity. This suppresses changes in the dimensions of the pattern before and after exposure.

Figure 3:
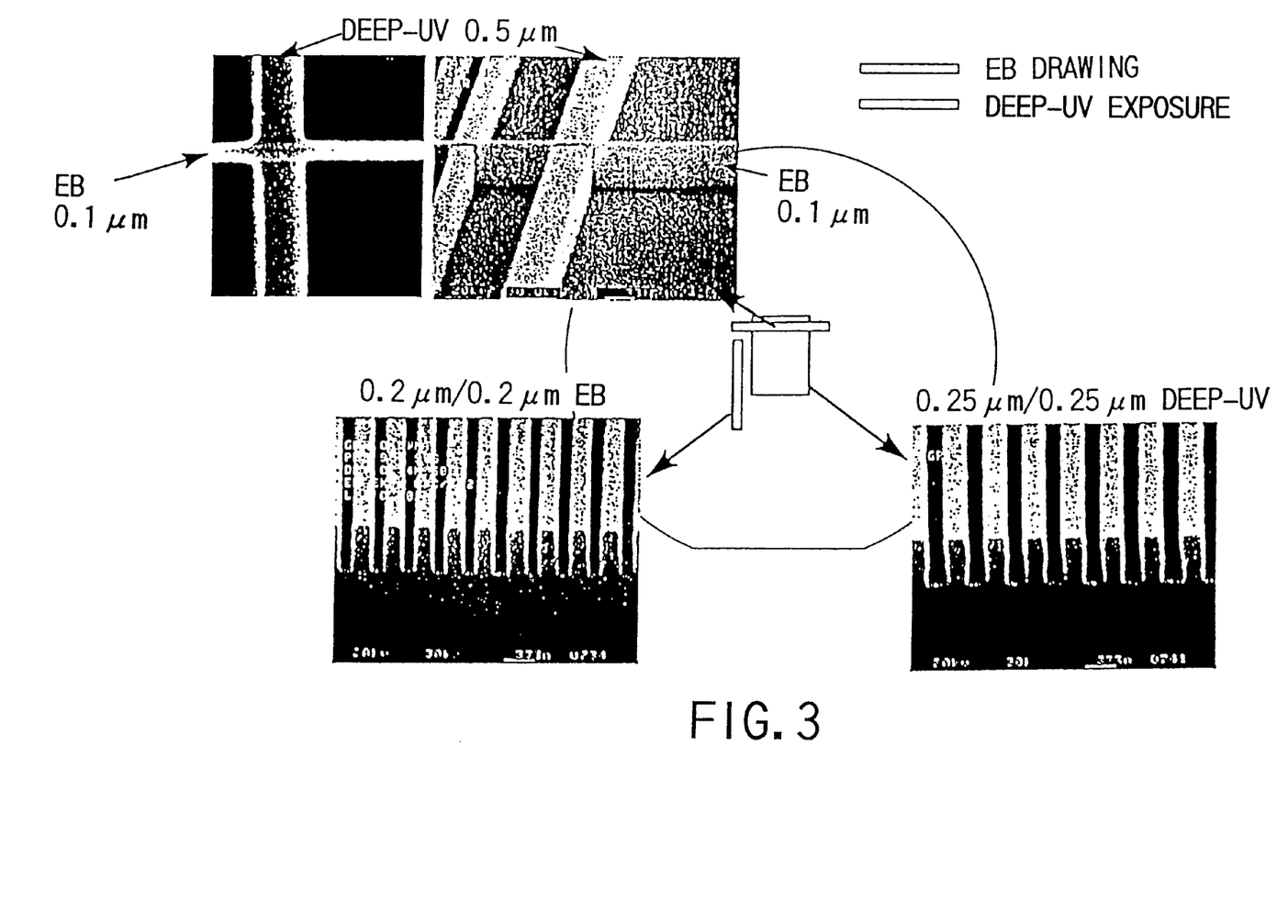
FIG. 3 illustrates an example of resist patterns formed with the lithographic system of FIG. 1.

By constructing the lithographic system as described above, it is possible to form a device pattern including a 0.1-$\mu$m-rule fine pattern with a high throughput. FIG. 3 shows an example of a fine pattern formed on a 0.5-$\mu$m-thick chemical-amplification negative resist (UVN) using the lithographic system. Up to 0.25-$\mu$m rough patterns were formed on the resist using a Deep-UV optical stepper 1 and less than 0.25-$\mu$m fine patterns were drawn on the resist by an electron beam. The developing solution used was a solution of TNAH and the requirements for development were 60 seconds according to 0.27 rule. The patterns up to 0.1 $\mu$m were successfully formed. This showed that the lithographic system had a sufficient resolving power.

The following TABLE 1 lists the results of a trial calculation of the throughput of the present lithographic system.

TABLE 1

|  | Only EB lithography Memory cell:CP Peripheral circuit:VSB | Deep-UV/EB Intra-level Mix & Match Memory cell:CP Peripheral circuit: DeepUV |
| --- | --- | --- |
| Evaluation sample 256 MDRAM gate layer | 0.3 wafers/hour | 2.84 wafers/hour |

CONDITION
Wafer : 8 inches
The number of chips : 100/wafer
CP-EB system : Hitachi HL-800D The exposure pattern used in the trial calculation of the throughput was the gate layer of a 0.15-$\mu$m-rule 256-Mbit DRAM. A trial calculation of the throughput was made for a case where the patterns for 100 chips were placed side by side all over an 8-inch wafer. The sensitivity of the resist was assumed to be 10-$\mu$m C/cm$^2$. The electron-beam drawing machine used for the trial calculation was a Hitachi HL-800D. For the performance of the machine, the following documents were referred to: (1) Y. Nakayama et al., J. Vac. Sci. Techno 1, B8(6), 1990, p. 1836, (2) Y. Shoda et al., J. Vac. Sci. Techno 1, B9(6), 1991, p. 2940, and (3) H. Itoh et al., J. Vac. Sci. Techno 1, B10(6), 1992, p. 2799. For the trial calculation, a single stepper and a single electron-beam exposure machine were used.

When the patterns were exposed only to an electron beam with a cell projection having five cells, the throughput was 0.3 wafer/h. In contrast, when patterns equal to or larger than the 0.25-$\mu$m rule were exposed by a Deep-UV stepper and patterns smaller than the 0.25-$\mu$m rule were exposed to an electron beam with a cell projection having five cells, the throughput was as high as 2.8 wafers/h. If three electron-beam exposure machines are installed in such a manner that the wafers from the stepper can be processed in parallel, these machines will achieve the throughput assuring that the machines will be sufficiently usable as mass-production tools.

As described above, with the present embodiment, it is possible to realize a mass-production system featuring not only the excellent resolving power of electron-beam exposure superior to that of light but also the throughput equal to that of the optical stepper.

Figure 4:
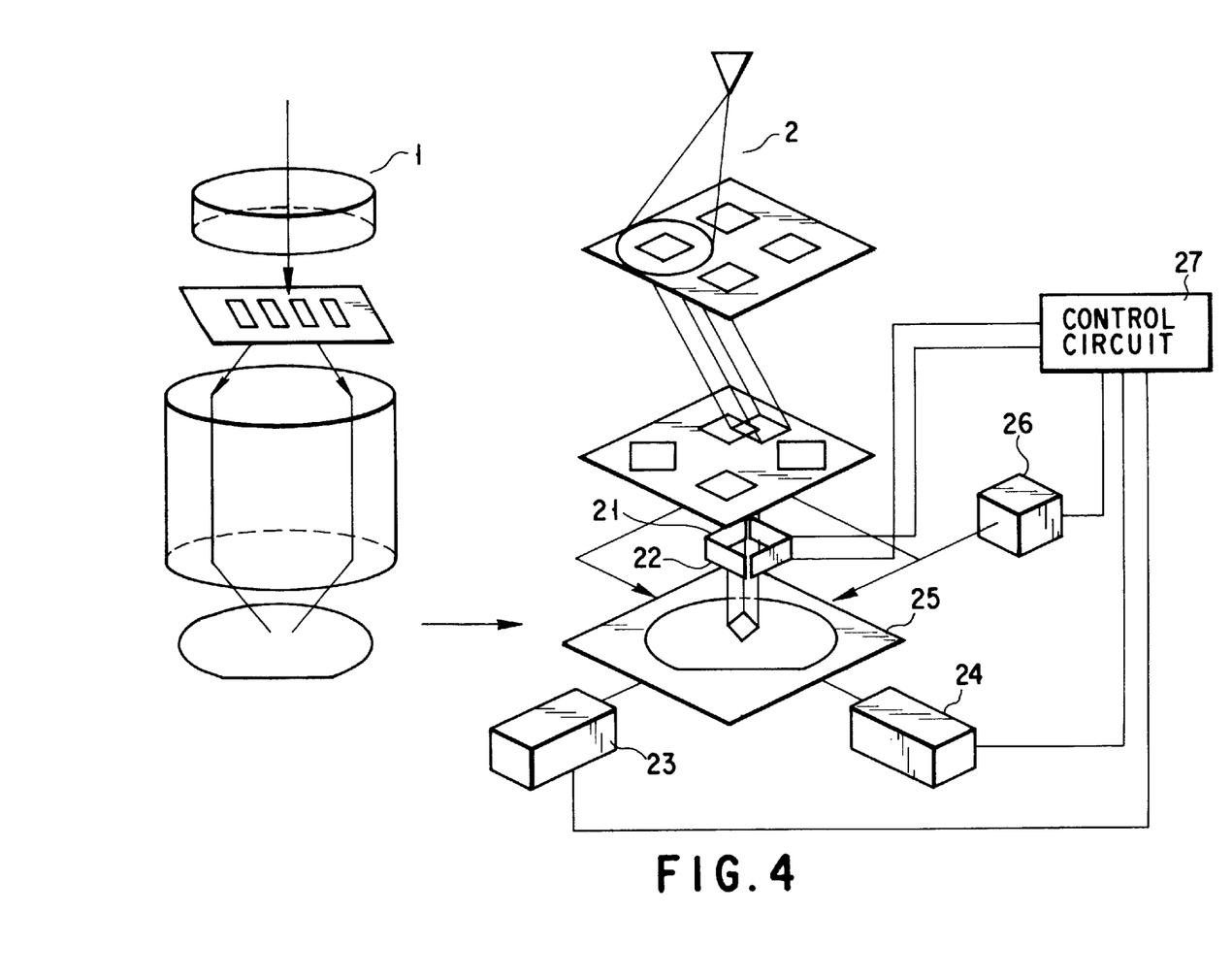
FIG. 4 shows a basic configuration required to align an electron-beam exposure fine pattern (or a fine pattern) with a light exposure rough pattern (or a rough pattern) in the lithographic system of FIG. 1.

FIG. 4 is a drawing to help explain a method of aligning a rough pattern in light exposure with a fine pattern in electron-beam exposure in the lithographic system. In FIG. 4, for the sake of explanation, it is assumed that a single electron-beam exposure machine 2 is used. In the electron-beam exposure machine 2, numerals 21 and 22 indicate deflectors for deflecting an electron beam. Numerals 23 and 24 represent X and Y driving mechanisms, respectively. Numeral 26 indicates a laser interferometer for measuring the position of a table 25, and 27 represents a control unit for deflecting the position of the electron beam on the basis of the pattern data.

Next, a method of matching the exposure position of the fine pattern with the rough pattern in the system constructed as described above will be explained. In a case where the same layer is exposed to both light and an electron beam, the rough pattern is aligned indirectly with the fine pattern. Specifically, using the same mark on the wafer 5 as a reference, the rough pattern and the fine patterns are exposed. In the optical stepper 1, the pattern on the reticle is slightly deformed because of the aberration of the lens and is reduced and exposed at a time. If electron-beam exposure is performed according to the design data, taking no account of the distortion of the pattern position, the relative positional relationship between the rough pattern and the fine pattern will be lost.

Since the slight deformation is inherent to the lens, it can be measured in advance. If in which direction and how much the rough pattern has shifted near the pattern subjected to electron-beam exposure, is known, the electron-beam exposure machine 2 will be able to control the position for each shot by using the deflectors 21 and 22. This makes it possible to form a total pattern by adjusting, on the basis of information on the distortion, the position of the pattern subjected to electron-beam exposure in such a manner that the relative positional relationship between the rough pattern and the fine pattern becomes more accurate.

Figure 5:
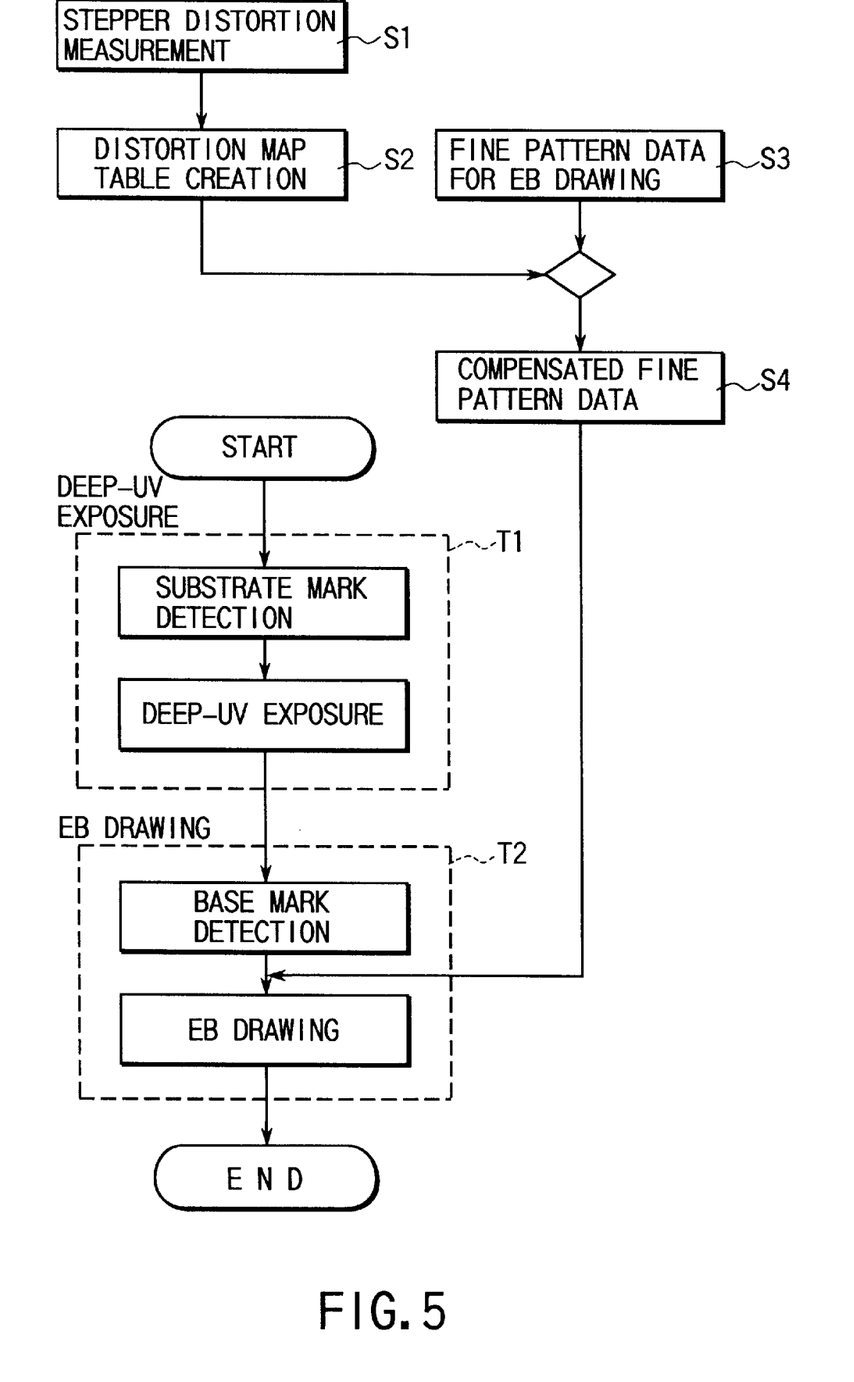
FIG. 5 is a flowchart for the aligning process in FIG. 4.

A concrete correcting method will be described by reference to a flowchart in FIG. 5. The lens distortion in the exposure field of the optical stepper 1 is measured beforehand (S1). On the basis of the distortion measurements, the field is divided into a suitable number of meshes and the direction of and the amount of the shift of the actual light exposure positions with respect to the ideal positions of the lattice points are listed in a table (S2). The map table is stored in an internal memory within the controller 7. Then, on the basis of the amount of shift from the lattice points, the controller 7 adjusts the fine pattern data (S3) so that the exposure position of the fine pattern exposed to the electron beam may be aligned with the exposure position of the actual rough pattern in light exposure (S4). Using the adjusted fine pattern data, the fine pattern is drawn on the resist with the electron beam.

Specifically, after only the rough pattern has been transferred at a time by the optical stepper 1 (T1), the wafer 5 is moved to the electron-beam exposure machine 2. Then, the fine pattern is exposed while the deflectors 21 and 22 are correcting the position of the pattern accurately on the basis of the adjusted data (T2). Further, the step (T1) may be executed after the step (T2).

As described above, by determining the exposure position of the electron beam projected later, taking into account a shift in the position of the pattern caused by light exposure, it is possible to form a pattern whose positional accuracy is almost the same as that when the pattern on the wafer 5 is exposed at a time using only light exposure. This prevents the relative position between the rough and fine patterns from being misaligned when one pattern is laid on top of the other pattern on another layer formed by light exposure.

Figure 6:
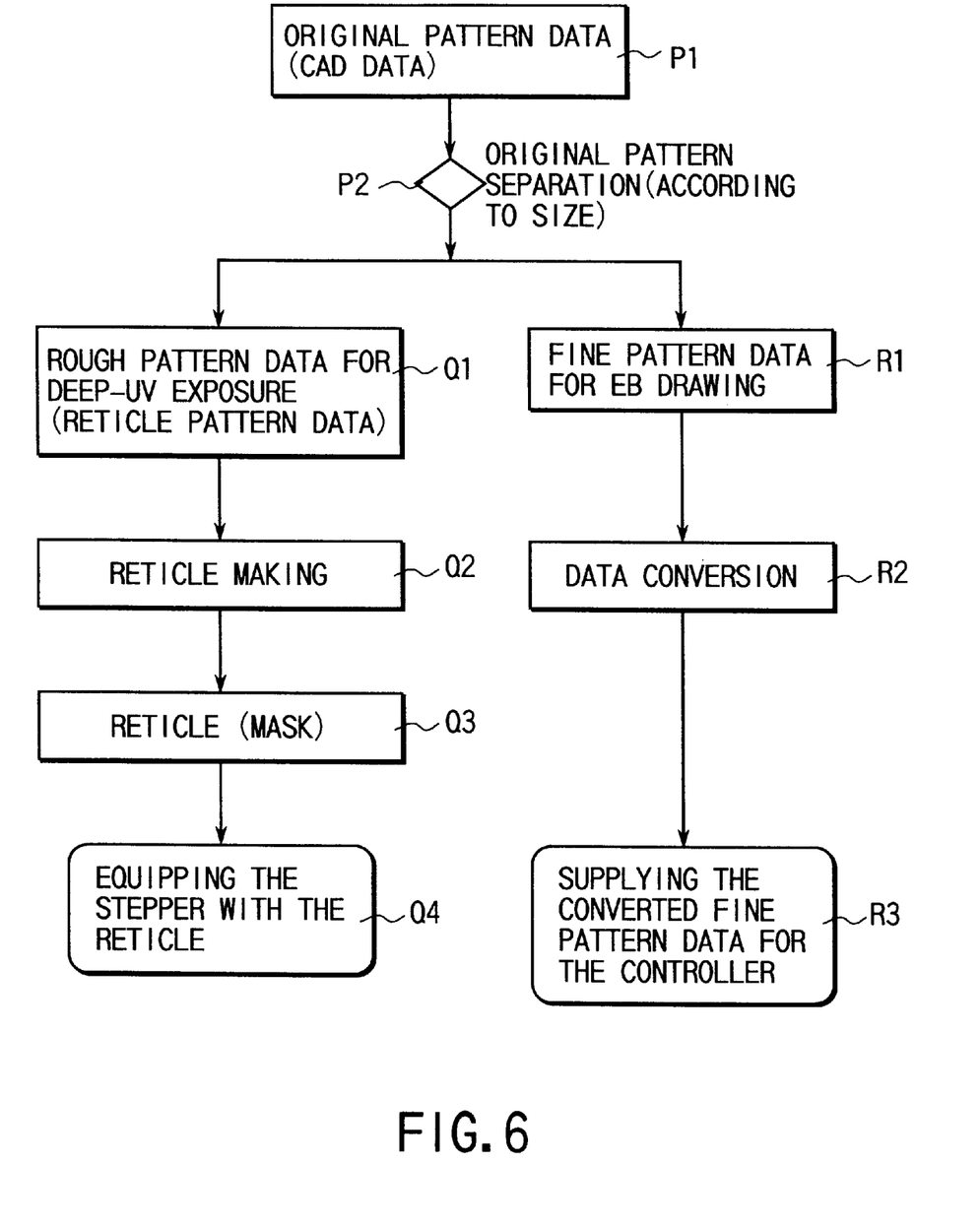
FIG. 6 is a flowchart for the process in which the pattern-dividing processor of FIG. 1 divides the original pattern into a rough pattern and a fine pattern.

FIG. 6 is a flowchart to help explain the formation of a reticle mask for a rough pattern for light exposure and the creation of the fine pattern data for electron-beam exposure in the lithographic system.

The pattern division processor 6 divides the original pattern data (P1) representing the device pattern into rough pattern data and fine pattern data (P2). The rough pattern data is for light exposure and exceeds the critical resolution of the optical stepper 1 used in the lithographic system or the limit value longer than the critical resolution by a specific distance. The fine pattern data does not exceed the critical resolution or the limit value.

An ordinary reticle forming process (Q2) is executed on the basis of the rough pattern data (Q1) to form a reticle mask (Q3). The formed reticle mask is placed on the optical stepper 1 and used to optically transfer a pattern exceeding the limit value at a time (Q4). On the other hand, the fine pattern data for electron-beam exposure (R1) is converted by the controller 7 into a suitable form of data usable in the electron-beam exposure machine 2 (R3) and the converted data is sent to the electron-beam exposure machine 2 (R3). Then, a fine pattern not exceeding the limit dimensions is projected on the wafer subjected to light exposure.

As described above, in the embodiment, CAD data on the device pattern is divided into the rough pattern data for light exposure and the fine pattern data for electron-beam exposure on the basis of the limit dimensions less strict than the critical resolution of the optical stepper 1 used in the lithographic system. This allows light exposure to handle the formation of rough patterns exceeding the critical resolution or the limit value in the original pattern, which makes it easier to produce a reticle, giving the exposure process more flexibility. On the other hand, electron-beam exposure takes charge of only the formation of fine patterns not exceeding the critical resolution or the limit value, which shortens the electron-beam exposure time remarkably. As a consequence, it is possible to realize a mass-production system featuring not only the excellent resolving power of electron-beam exposure superior to that of light but also the throughput equal to that of the optical stepper.

Figure 7A:
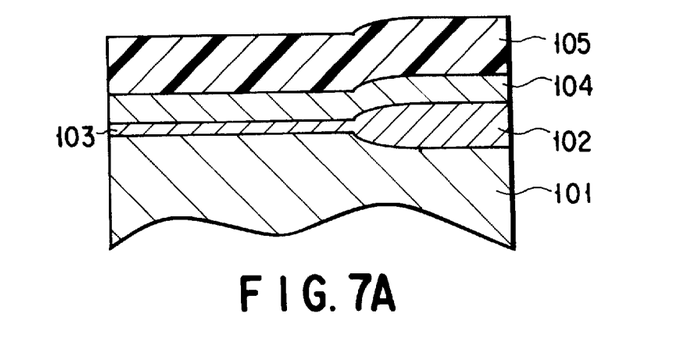
FIG. 7A is a sectional view of a semiconductor device formed by the lithographic method of the present invention.
Figure 7B:
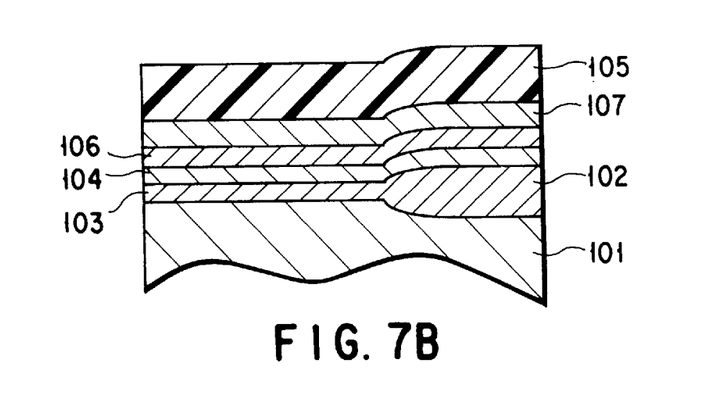
FIG. 7B is a sectional view of another semiconductor device formed by the lithographic method of the present invention.
Figure 7C:
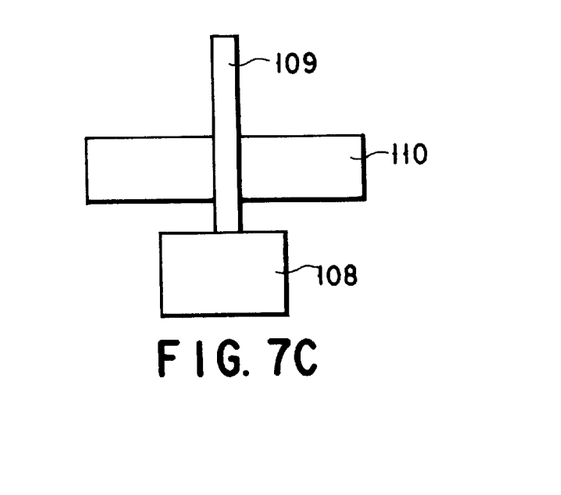
FIG. 7C is a plan view of a gate electrode formed by the lithographic method of the present invention.

FIGS. 7A to 7C are drawings to help explain how to produce a semiconductor device by the pattern forming method of the present invention. Explanation will be given using an example of forming a gate electrode of a MOSFET.

FIG. 7A shows a basic structure of a semiconductor device produced with the lithographic system of the embodiment. In FIG. 7A, on the surface of a semiconductor substrate 101, an element isolating oxide film 102 and a gate oxide film 103 are formed. On the element isolating oxide film and gate oxide film, a polysilicon region 104 and a resist 105 are deposited. Although a step developed as a result of LOCOS (Local Oxidation of Silicon), a selective oxidation method using Si3N4 as an oxidation mask, has been illustrated, the invention may be applied to steps caused by another element-isolating method, such as STI (Shallow Trench Isolation). The resist 105 is a resist sensitive to both Deep-UV light and an electron beam, such as UVN-HS, with a thickness of about 500 nm.

FIG. 7B shows another structure of a semiconductor device produced with the lithographic system of the embodiment. In FIG. 7B, a gate electrode region is composed of a polysilicon region 104 and a low-resistance layer region 106 such as tungsten silicide. On the gate electrode region, a silicon nitride film region 107 is deposited. The silicon nitride film is used as a mask material in processing tungsten silicide by reactive ion etching (RIE) or used in the self-align contact (SAC) process. On the silicon nitride film 107, a resist region 105 is deposited. The mask material may be a silicon oxide film. The low-resistance layer region 106 is not restricted to silicide and may be a suitable metal, such as tungsten.

FIG. 7C is a plan view of a gate electrode exposed to an electron beam. In FIG. 7C, numeral 108 indicates a contact pattern, 109 a gate pattern, and 110 a source-drain pattern. Since the focal depth is as deep as several $\mu$m or more during exposure to an electron beam, this provides a great exposure latitude to a step incomparable with the exposure latitude during exposure to ordinary Deep-UV light. The great exposure latitude makes it possible to effect accurate patterning in a step portion between the element region and the element-isolating region without permitting the resist from breaking.

Hereinafter, the process of forming a gate electrode by a semiconductor manufacturing method using the lithographic system of the present invention will be explained by reference to FIGS. 8A to 8D.

Figure 8A:
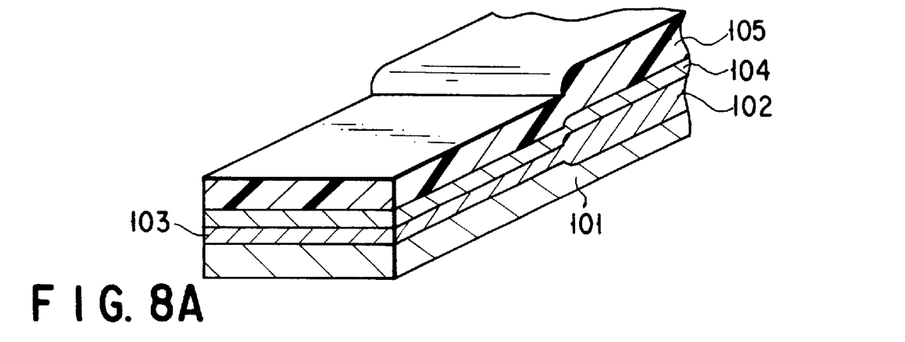
FIG. 8A is a perspective view of a wafer immediately before lithography in a case where a gate electrode is formed by the lithographic method of the present invention.

As shown in FIG. 8A, on a semiconductor substrate 101, a gate oxide film region 103 and an element-isolating oxide film region 102 are formed. On the gate oxide film and element-isolating oxide film region, a 200-nm-thick polysilicon region 104 is formed. On the polysilicon region, a 500-nm resist region 105 is formed. The resist is a negative resist. The entire pattern on the resist is formed by exposing only the gate to an electron beam and the remaining portions to Deep-UV light.

Figure 8B:
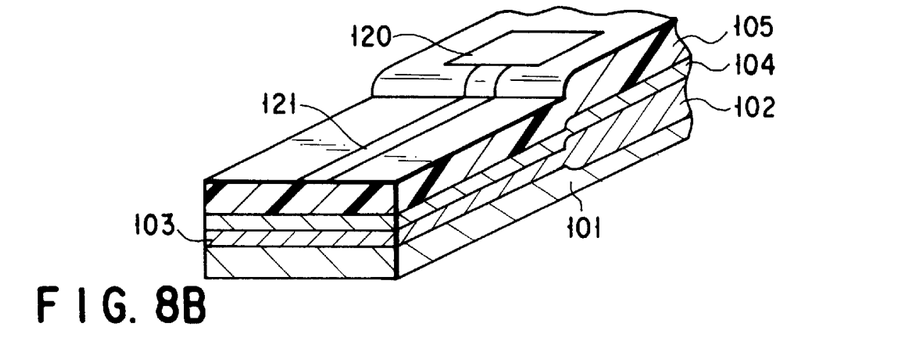
FIG. 8B is a perspective view of the wafer subjected to lithography in the step following the step of FIG. 8A.

First, the pattern is exposed to Deep-UV light. FIG. 8B shows a latent image 120 formed in the resist by light exposure. The latent image can be checked by projecting a low-accelerated electron beam and sensing the secondary electrons generated.

Then, the pattern is aligned and the fine line portions (121) are patterned with the electron-beam exposure machine. The latent image formed by electron-beam exposure is also shown in FIG. 8B.

Figure 8C:
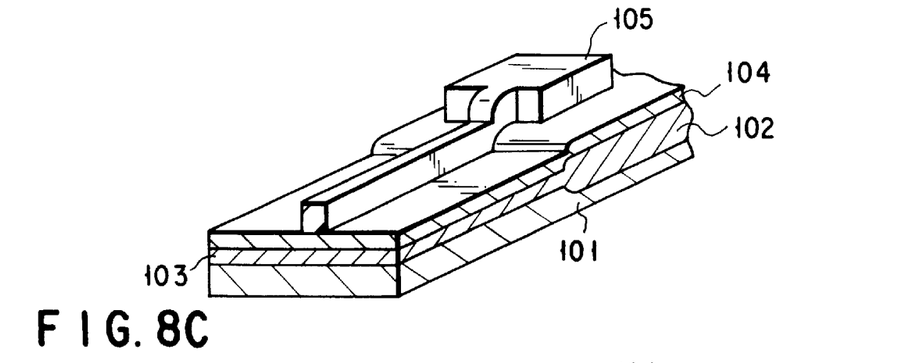
FIG. 8C is a perspective view of the wafer on which the resist has been developed in the step following the step of FIG. 8B.
Figure 8D:
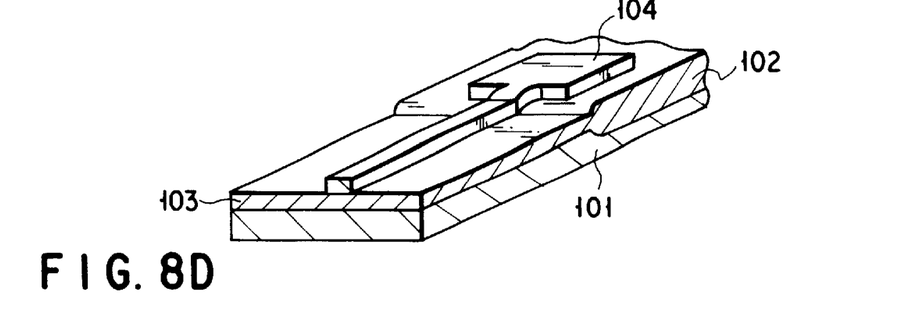
FIG. 8D is a perspective view of the wafer subjected to RIE (etching) in the step following the step of FIG. 8C.

Next, the resist is developed and the state of FIG. 8C is produced. For the development of the resist, a TMAH solution complying with 0.27 rule is used. Thereafter, the RIE process is carried out on the basis of the resist pattern to form a gate electrode as shown in FIG. 8D.

As shown in FIG. 7B, when a low-resistance silicide region, such as WSi, and a polysilicon stacked structure are used as a gate electrode, it is difficult to perform RIE with a resist mask to the end, because of the RIE selection ratio. To avoid this problem, the pattern is transferred to an SiN region once and the WSi and polysilicon are subjected to RIE again with the transferred pattern as a mask. In the case of only polysilicon, because the selection ratio of polysilicon to the resist in RIE is about 10, only the resist mask is sufficient and is used as a stopper film in the SAC process.

As described above, with the embodiment, patterns not exceeding the critical resolution of photolithography can be formed easily. Furthermore, resist patterns can be formed with a throughput almost equal to that of a conventional optical stepper. Moreover, use of an electron beam to expose fine patterns adds an allowance to the focal depth in the step portion inevitably developed between the element region and the element-isolating region, which makes it possible to form fine patterns with high accuracy. This leads to the elimination of a flattening process for reducing steps, which contributes to shortening the processes. The method is applicable the patterning of the fine regions in not only MOSFETs but also bipolar transistors.

The present invention is not limited to the above-described embodiments. The optical stepper is not restricted to the Deep-UV stepper and may be a stepper for another wavelength region. Although it is most preferable to use an electron-beam exposure machine of the cell projection type, an ordinary drawing type may be used when there are fewer patterns to be formed by electron-beam exposure. The number of optical steppers and electron-beam exposure machines used in parallel may be changed according to specifications. An ion-beam exposure machine, which uses an ion beam instead of an electron beam, may be used.

While in the embodiments, explanation has been given, centering on the gate electrode of a MOSFET, the above-described method is applicable to the patterning of various semiconductor elements, such as element regions, contact holes, and metallic interconnection layers.

The present invention may be practiced or embodied in still other ways without departing from the spirit or essential character thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A pattern forming method of forming a desired pattern on a photosensitive material on a substrate by using both light exposure and charge-beam exposure, comprising:

a step (a) of forming, by light exposure, a rough pattern exceeding the resolution limit of said light exposure in said desired pattern; and a step (b) of forming, by charge-beam exposure, a fine pattern not exceeding the resolution limit of said light exposure in said desired pattern.

2. A pattern forming method according to claim 1, further comprising a step (c) of developing said photosensitive material after said steps (a) and (b) have been completed.

3. A pattern forming method according to claim 1, wherein said photosensitive material is a chemical amplification negative resist or positive resist sensitive to both light and a charge beam.

4. A pattern forming method according to claim 1, wherein the wavelength of light for said light exposure belongs to a far ultraviolet region.

5. A pattern forming method according to claim 1, wherein said step (b) includes a substep of simultaneously exposing part of the repetitive portions in said desired pattern.

6. A pattern forming method according to claim 1, wherein said photosensitive material is composed of an antireflection film and a resist.

7. A pattern forming method according to claim 6, wherein at least one of said resist and said antireflection film is conductive.

8. A pattern forming method according to claim 1, further comprising a step (d) of dividing data on said desired pattern into data on said rough pattern and data on said fine pattern on the basis of the critical resolution of said light exposure.

9. A pattern forming method according to claim 8, wherein said step (d) includes a substep of adjusting data on position information of said fine pattern on the basis of a shift in the position of said light exposure.

10. A pattern forming method according to claim 1, wherein said charge beam is an electron beam.

\* \* \* \* \*